(12) United States Patent
Hirota et al.

(10) Patent No.: US 9,905,621 B2
(45) Date of Patent: Feb. 27, 2018

(54) ORGANIC EL DISPLAY DEVICE

(71) Applicant: Futaba Corporation, Mobara-shi, Chiba (JP)

(72) Inventors: Yuki Hirota, Mobara (JP); Yukio Kamiyama, Mobara (JP); Keisuke Kawana, Mobara (JP); Saori Imanishi, Mobara (JP); Keisuke Watanabe, Mobara (JP)

(73) Assignee: FUTABA CORPORATION, Chiba (JP)

( * ) Notice: Subject to any disclaimer, the term of this patent is extended or adjusted under 35 U.S.C. 154(b) by 0 days.

(21) Appl. No.: 15/427,850

(22) Filed: Feb. 8, 2017

(65) Prior Publication Data

US 2017/0229521 A1   Aug. 10, 2017

(30) Foreign Application Priority Data

Feb. 10, 2016   (JP) .................................. 2016-023841

(51) Int. Cl.
H01L 27/32 (2006.01)

(52) U.S. Cl.
CPC ........ *H01L 27/323* (2013.01); *H01L 27/3276* (2013.01); *H01L 27/3288* (2013.01)

(58) Field of Classification Search
None
See application file for complete search history.

(56) References Cited

U.S. PATENT DOCUMENTS

| 9,746,976 | B2* | 8/2017 | Leong ..................... G06F 3/044 |
| 2004/0141096 | A1* | 7/2004 | Mai ..................... G02F 1/13338 349/12 |
| 2010/0214245 | A1* | 8/2010 | Hirota ................. G02F 1/13338 345/173 |
| 2010/0302178 | A1 | 12/2010 | Liu et al. |
| 2012/0194467 | A1* | 8/2012 | Huang .................... G06F 3/045 345/174 |
| 2013/0026501 | A1* | 1/2013 | Liu ........................ G06F 3/0412 257/88 |

(Continued)

FOREIGN PATENT DOCUMENTS

| CN | 103258840 | 8/2013 |
| JP | 2003-296032 | 10/2003 |

(Continued)

*Primary Examiner* — Michael Lebentritt
(74) *Attorney, Agent, or Firm* — Hamre, Schumann, Mueller & Larson, P.C.

(57) ABSTRACT

An organic electro-luminescence display device includes: a first substrate having transmissive properties; a touch electrode for a touch sensor, the touch electrode being provided on a main surface of the first substrate; an insulating film provided on the main surface and covering the touch electrode wherein the insulating film includes a first surface at the touch electrode-side and a second surface opposite to the first surface; an organic light-emitting element provided on the second surface of the insulating film; a second substrate provided facing the main surface of the first substrate; and an integrated circuit electrically connected with both the touch electrode and the organic light-emitting element. The touch electrode, the insulating film, and the organic light-emitting element are interposed between the first substrate and the second substrate.

7 Claims, 5 Drawing Sheets

(56) References Cited

U.S. PATENT DOCUMENTS

| | | | |
|---|---|---|---|
| 2013/0278516 A1* | 10/2013 | Nagata | G06F 3/041 345/173 |
| 2013/0314625 A1 | 11/2013 | Tsai et al. | |
| 2017/0146867 A1* | 5/2017 | Wang | G02F 1/134309 |
| 2017/0235401 A1* | 8/2017 | Abe | G06F 3/0412 345/174 |
| 2017/0271617 A1* | 9/2017 | Choi | H01L 27/3244 |
| 2017/0285808 A1* | 10/2017 | Aridomi | B32B 27/30 |

FOREIGN PATENT DOCUMENTS

| | | |
|---|---|---|
| JP | 2010-243930 | 10/2010 |
| TW | 201215947 | 4/2012 |
| TW | I390280 | 3/2013 |
| TW | I477846 | 3/2015 |
| TW | I477851 | 3/2015 |

\* cited by examiner

ORGANIC EL DISPLAY DEVICE

TECHNICAL FIELD

The present disclosure related to an organic EL display device.

BACKGROUND

Recently, an organic EL display device including an organic light-emitting element containing an organic electro-luminescence (EL) material has attracted attention as a display device. For example, an organic EL display device mounted on a mobile device such as a cellular phone includes a touch panel. Japanese Unexamined Patent Publication No. 2010-243930 discloses an organic EL display device that has an organic EL panel including a top-emission organic light-emitting element and a touch panel mounted thereon.

SUMMARY

In Japanese Unexamined Patent Publication No. 2010-243930, the organic EL panel and the touch panel are respectively formed from separate substrates. In this case, substrates for both the organic EL panel and the touch panel are needed for the organic EL display device. In Japanese Unexamined Patent Publication No. 2010-243930, integrated circuits for both the organic EL panel and the touch panel are used. Thus, the number of components of the conventional organic EL display device including a touch panel is larger than the number of components of an organic EL display device including no touch panel.

An organic EL display device according to an aspect of the present invention includes: a first substrate having transmissive properties; a touch electrode for a touch sensor, the touch electrode being provided on a main surface of the first substrate; an insulating film provided on the main surface and covering the touch electrode wherein the insulating film includes a first surface at the touch electrode-side and a second surface opposite to the first surface; an organic light-emitting element provided on the second surface of the insulating film; a second substrate provided facing the main surface of the first substrate; and an integrated circuit electrically connected with both the touch electrode and the organic light-emitting element. The touch electrode, the insulating film, and the organic light-emitting element are interposed between the first substrate and the second substrate.

In this organic EL display device, the touch electrode for a touch sensor is provided on the main surface of the first substrate, and the organic light-emitting element is provided on this main surface with the touch electrode and the insulating film interposed therebetween. With this configuration, the touch sensor and the organic light-emitting element do not need to be formed using separate substrates. The integrated circuit included in the organic EL display device is electrically connected with both the touch electrode and the organic light-emitting element. With this configuration, it is possible to use the integrated circuit common to both the touch sensor and the organic light-emitting element. Thus, the above-described organic EL display device can achieve a reduced number of components.

The above-described organic EL display device may further include a wiring terminal electrically connected with the integrated circuit, the wiring terminal may be provided overlapping part of the touch electrode with the insulating film interposed between the touch electrode and the wiring terminal, and the touch sensor and the integrated circuit may be electrically connected with each other through a capacitor constituted by the touch electrode, the insulating film, and the wiring terminal. With this configuration, for example, even when the insulating film is not provided with an opening so as not to bring the wiring terminal and the touch electrode into contact with each other through the opening, the touch electrode and the integrated circuit can be electrically connected with each other. In this case, a process of forming the opening in the insulating film can be omitted, and thus a cost of manufacturing the organic EL display device can be reduced.

The above-described organic EL display device may further include a wiring terminal electrically connected with the integrated circuit, the wiring terminal may be provided in touch with the touch electrode, and the wiring terminal may be connected with the touch electrode through an opening provided in the insulating film. In this case, the integrated circuit and the touch electrode can be electrically connected with each other through the wiring terminal in a reliable manner.

The organic light-emitting element does not need to overlap with an edge of the touch electrode in plan view. In this case, in plan view, coexistence of a region in which the organic light-emitting element overlaps with the touch electrode and a region in which the organic light-emitting element does not overlap with the touch electrode can be prevented. Accordingly, light emission unevenness of the organic light-emitting element due to the touch electrode can be reduced.

A plurality of the touch electrodes may be provided on the main surface of the first substrate, a plurality of the organic light-emitting elements may be provided on the insulating film, and each of the organic light-emitting elements may overlap with any one of the touch electrodes but with none of edges of the touch electrodes in plan view. In this case, even when the organic light-emitting elements are provided on the insulating film, no region in which the organic light-emitting elements overlap with none of the touch electrodes is formed. Accordingly, light emission unevenness occurring to each organic light-emitting element due to the touch electrodes can be reduced.

A plurality of the touch electrodes may be provided on the main surface of the first substrate, a plurality of the organic light-emitting elements may be provided on the insulating film, part of the organic light-emitting elements may overlap with any one of the touch electrodes but with none of edges of the touch electrodes in plan view, and rest of the organic light-emitting elements may overlap with none of the touch electrodes in plan view. In this case, none of the organic light-emitting elements partially overlaps with the touch electrodes in plan view. Thus, light emission unevenness due to the touch electrodes is reduced in both of the part of the organic light-emitting elements overlapping with any one of the touch electrodes, and the rest of the organic light-emitting elements overlapping with none of the touch electrodes.

The integrated circuit may be provided between the first substrate and the second substrate.

DETAILED DESCRIPTION

Preferred embodiments of the present invention will be described in detail below with reference to the accompanying drawings. In the following description, any identical elements or elements having an identical function are denoted by an identical reference sign, and any duplicate description will be omitted.

First, the configuration of an organic EL display device 1 according to the present embodiment will be described with reference to FIGS. 1 and 2.

Figure 1:
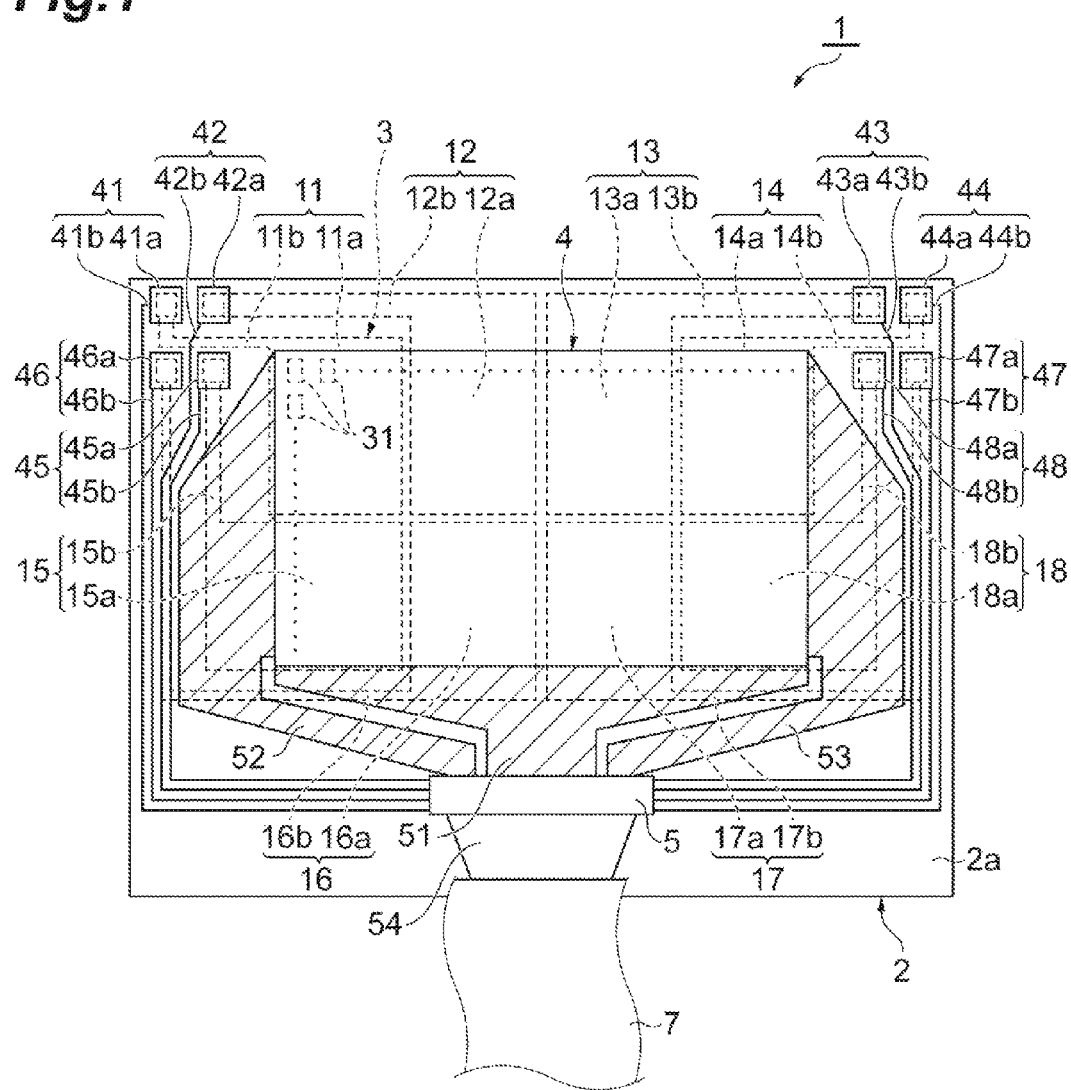
FIG. 1 is a schematic plan view illustrating part of an organic EL display device according to an embodiment.
Figure 2:
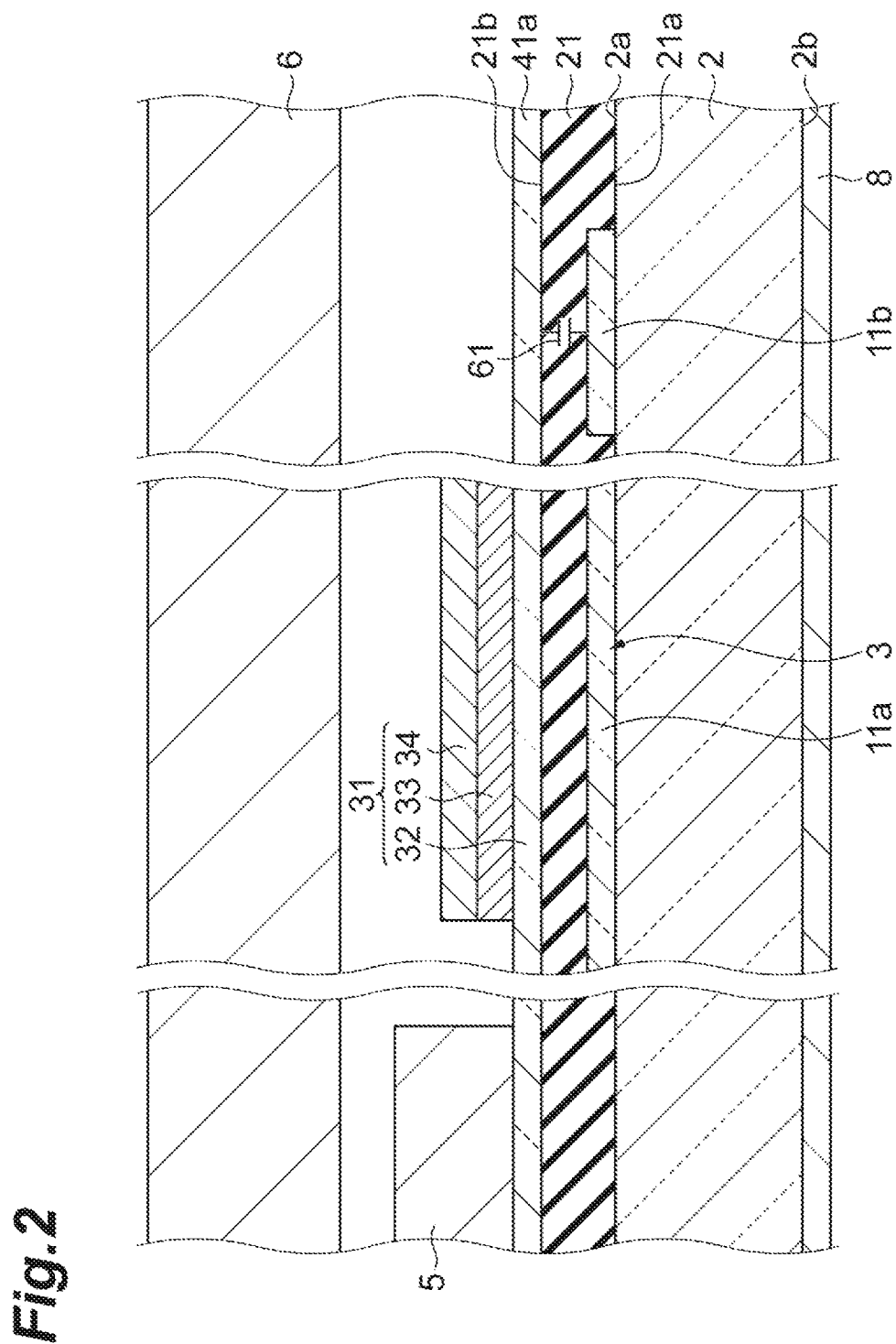
FIG. 2 is a schematic cross-sectional view illustrating a main part of the organic EL display device according to the embodiment.

As illustrated in FIGS. 1 and 2, the organic EL display device 1 is, for example, a passive matrix display device. The organic EL display device 1 includes a first substrate 2, a touch sensor 3 provided on a main surface 2a of the first substrate 2, a light-emitting region 4 defined on the touch sensor 3, an integrated circuit 5 electrically connected with the touch sensor 3, and a second substrate 6 provided facing the first substrate 2 with the touch sensor 3, the light-emitting region 4, and the integrated circuit 5 interposed therebetween.

The first substrate 2 is a transmissive substrate, and has a substantially rectangular shape in plan view. Thus, the main surface 2a of the first substrate 2, and a main surface 2b facing the main surface 2a each have a substantially rectangular shape. The thickness of the first substrate 2 is, for example, 100 µm to 1000 µm. Examples of the first substrate 2 include a glass substrate, a ceramics substrate, and a flexible substrate (for example, a plastic substrate). In the present embodiment, a glass substrate is used as the first substrate 2. A polarization film 8 configured to polarize light transmitting through the first substrate 2 is provided on the main surface 2b. In the present embodiment, a plan view is a view in the normal direction of the main surface 2a.

The touch sensor 3 is an electrostatic capacitive sensor configured to detect a conductive material (detection target) positioned on the main surface 2b of the first substrate 2. The touch sensor 3 includes touch electrodes 11 to 18 provided on the main surface 2a, and the integrated circuit 5. In the touch sensor 3, when a detection target comes close to the first substrate 2, the integrated circuit 5 detects a change in capacitance due to at least one of the touch electrodes 11 to 18 and the detection target. Accordingly, the touch sensor 3 can detect the presence of any detection target in contact with the first substrate 2. Description of the touch electrodes 11 to 18, and description of a connection configuration between the touch electrodes 11 to 18 and the integrated circuit 5 will be given later.

As illustrated in FIG. 2, the touch electrode 11 of the touch sensor 3 is covered by an insulating film 21 provided on the main surface 2a. The insulating film 21 is a transmissive and insulating film, and provided covering the main surface 2a. The thickness of the insulating film 21 is, for example, 100 nm to 1000 nm. The insulating film 21 is, for example, a silicon oxide film (SiOx film). The insulating film 21 is formed on the main surface 2a by a chemical vapor deposition method (CVD method), the main surface being formed on the touch electrodes 11 to 18, for example. Thus, the touch electrodes 11 to 18 are covered by the insulating film 21.

The light-emitting region 4 is a region capable of generating light in the organic EL display device 1, and is defined at a central part of the main surface 2a of the first substrate 2. A plurality of organic light-emitting elements 31 disposed in matrix are provided in the light-emitting region 4. The interval between the organic light-emitting elements 31 adjacent to each other in plan view is, for example, 10 µm to 50 µm. Illustration of, for example, a partition provided in the light-emitting region 4 is omitted.

Each organic light-emitting element 31 is an element configured to emit light when supplied with current, and as illustrated in FIG. 2, has a configuration in which an organic light-emitting layer 33 is interposed between a pair of electrodes 32 and 34. The organic light-emitting element 31 is provided on a second surface 21b of the insulating film 21, the second surface 21b being opposite to a first surface 21a of the insulating film 21, and the first surface 21a being closer to the touch electrodes 11 to 18 than the second surface 21b. In other words, the organic light-emitting element 31 is provided on a surface of the insulating film 21, the surface being closer to the second substrate 6 than the other surface of the insulating film 21.

The electrode 32 is a conductive layer functioning as an anode of the organic light-emitting element 31, and is positioned closest to the first substrate 2, in the organic light-emitting element 31. The electrode 32 is a patterned transparent conductive layer. Examples of the material of the electrode 32 include indium tin oxide (ITO) and indium zinc oxide (IZO). The thickness of the electrode 32 is, for example, 100 nm to 500 nm. The electrode 32 is formed by, for example, a physical vapor deposition method (PVD method).

The organic light-emitting layer 33 is a layer containing at least organic compound (light-emitting material) that emits light through injection of an electron and a hole, and is provided on the electrode 32. The organic compound may be low-molecular compound or high-molecular compound. The organic light-emitting layer 33 may include, in addition to the light-emitting layer containing a light-emitting material, an electron injection layer, an electron transport layer, a hole transport layer, a hole injection layer and the like. Light generated by the organic light-emitting layer 33 may be, for example, single-color light such as red light or blue light, or may be white light. When the organic light-emitting layer 33 generates white light, the organic light-emitting layer 33 may include a plurality of light-emitting layers configured to generate light in different colors. The thickness of the organic light-emitting layer 33 is, for example, 100 nm to 500 nm. The organic light-emitting layer 33 is formed by, for example, a dry method such as a vacuum evaporation method or a wet method such as ink jet. A fluorescence material or a phosphorescent material may be used as the light-emitting material.

The electrode 34 is a conductive layer functioning as a cathode of the organic light-emitting element 31, and is provided on the organic light-emitting layer 33. The electrode 34 includes, for example, a single or a plurality of light absorbing or light reflecting conductive layers. Aluminum, silver, or alkali-earth metal (such as magnesium or calcium) is used as the material (conductive material) of each conductive layer included in the electrode 34. The thickness of the electrode 34 is, for example, 100 nm to 500 nm. The electrode 34 is formed by, for example, a PVD method.

The integrated circuit 5 is a circuit electrically connected with both the touch sensor 3 and the organic light-emitting elements 31. The integrated circuit 5 is configured to control them, and is mounted outside of the light-emitting region 4 on the first substrate 2 in plan view. For example, various kinds of IC chips are used as the integrated circuit 5. The integrated circuit 5 is electrically connected with the touch sensor 3 through wires 41 to 48 provided on the insulating film 21. The integrated circuit 5 is electrically connected with the organic light-emitting elements 31 inside of the light-emitting region 4 through wiring regions 51 to 53 provided on the insulating film 21. The wiring regions 51 to 53 are each a region in which a plurality of wires are provided. Details of the wires 41 to 48 will be described later.

The second substrate 6 is a substrate having a size substantially identical to the first substrate 2 in plan view. Thus, the second substrate 6 has a substantially rectangular shape in plan view. The second substrate 6 is provided facing the first substrate 2 with the touch electrodes 11 to 18, the insulating film 21, the organic light-emitting elements 31, and the integrated circuit 5 interposed therebetween. In other words, the touch electrodes 11 to 18, the insulating film 21, the organic light-emitting elements 31, and the integrated circuit 5 are provided between the first substrate 2 and the second substrate 6. Examples of the second substrate 6 include a glass substrate, a ceramics substrate, and a flexible substrate (for example, a plastic substrate or a stainless-steel substrate). For example, the second substrate 6 is bonded to the first substrate 2 by adhesive having a frame shape and being provided around the organic light-emitting elements 31. Accordingly, the organic light-emitting elements 31 are sealed by the first substrate 2, the second substrate 6, and the adhesive.

A flexible printed circuit (FPC) 7 for connection with an external device is attached to the organic EL display device 1. The flexible printed circuit 7 is electrically connected with the integrated circuit 5 through a wiring region 54 provided on the insulating film 21. Similarly to the wiring regions 51 to 53, the wiring region 54 is a region in which a plurality of wires are provided, and is formed simultaneously with the wiring regions 51 to 53.

The following describes the touch electrodes 11 to 18. The touch electrodes 11 to 18 are patterned transparent conductive layers, and disposed in matrix on the first substrate 2, respectively. The touch electrodes 11 to 14 and the touch electrodes 15 to 18 are sequentially arrayed in a longitudinal direction of the main surface 2a. The touch electrodes 11 to 14 are provided further away from the integrated circuit 5 than the touch electrodes 15 to 18. The touch electrodes 11 to 18 are provided separately from each other. The touch electrodes 11 to 18 are each independently electrically connected with the integrated circuit 5. Accordingly, the integrated circuit 5 can detect the change in capacitance at each of the touch electrodes 11 to 18, and thus can detect the position of the detection target. Examples of the material of the touch electrodes 11 to 18 include ITO and IZO. The touch electrodes 11 to 18 are formed by, for example, a PVD method. As described above, the touch electrodes 11 to 18 are transparent conductive layers, and thus light generated by the organic light-emitting elements 31 is externally emitted through the touch sensor 3 and the first substrate 2.

The touch electrode 11 includes a detection region 11a configured to detect the detection target, and a connection region 11b for connecting the detection region 11a with the integrated circuit 5. The detection region 11a has a substantially rectangular shape in plan view, and part or all of the detection region 11a overlaps with the light-emitting region 4. The connection region 11b extends on the first substrate 2 such that an end part of the connection region 11b overlaps with the wire 41 in plan view. Similarly to the touch electrode 11, the touch electrodes 12 to 18 include detection regions 12a to 18a and connection regions 12b to 18b, respectively. The detection regions 12a to 18a each have a substantially rectangular shape in plan view, and overlap with the light-emitting region 4. The connection regions 12b to 18b extend on the first substrate 2 such that end parts of the connection regions 12b to 18b overlap with the wires 42 to 48, respectively, in plan view. The interval between the detection regions adjacent to each other on the light-emitting region 4 is, for example, 10 μm approximately, and is not larger than the interval between the organic light-emitting elements 31 adjacent to each other. The sizes of the detection regions 11a to 18a of the touch electrodes 11 to 18 are each substantially same as the size of each region obtained by dividing the light-emitting region 4 into eight (two rows by four columns), and the touch electrodes 11 to 18 are provided such that the detection regions 11a to 18a each overlap with any one of these divided regions.

The following describes connection between the touch electrodes 11 to 18 for the touch sensor 3 and the integrated circuit 5. As described above, the integrated circuit 5 is electrically connected with the touch sensor 3 through the wires 41 to 48. The integrated circuit 5 is electrically connected with the touch electrode 11 through the wire 41. The wire 41 includes a terminal part (wiring terminal) 41a overlapping with the connection region 11b of the touch electrode 11, and a routing part 41b connecting the integrated circuit 5 and the terminal part 41a.

The terminal part 41a has a substantially rectangular shape in plan view and is provided overlapping with the end part of the connection region 11b with the insulating film 21 interposed therebetween. Thus, a capacitor 61 is formed from the terminal part 41a, the insulating film 21, and the connection region 11b, and the touch electrode 11 and the integrated circuit 5 are electrically connected with each other through the wire 41 and the capacitor 61.

Similarly to the wire 41, the wires 42 to 48 include terminal parts 42a to 48a and routing parts 42b to 48b, respectively. The terminal parts 42a to 48a each have a substantially rectangular shape in plan view, and are provided overlapping with the connection regions 12b to 18b, respectively, with the insulating film 21 interposed therebetween. Accordingly, the touch electrodes 12 to 18 are electrically connected with the wires 42 to 48, respectively, through capacitors.

The terminal part 41a, 42a, 45a, and 46a are provided near one of the four corners of the main surface 2a outside of the light-emitting region 4. The terminal parts 43a, 44a, 47a, and 48a are provided near another one of the four corners of the main surface 2a outside of the light-emitting region 4. The wires 41 to 48 are formed simultaneously with the electrode 32 of each organic light-emitting element 31. Thus, the wires 41 to 48 each include a transparent conductive layer. The wires 41 to 48 may each have a laminated structure. In this case, the wires 41 to 48 each include, for example, a transparent conductive layer formed simultaneously with the electrode 32 and a conductive layer formed simultaneously with the electrode 34. Accordingly, the resistance values of the wires 41 to 48 can be decreased.

In the organic EL display device 1 according to the present embodiment described above, the touch electrodes 11 to 18 for the touch sensor 3 are provided on the main surface 2a of the first substrate 2, and each organic light-emitting element 31 is provided on the main surface 2a with the touch electrodes 11 to 18 and the insulating film 21 interposed therebetween. Thus, it is not necessary to form the touch sensor 3 and the organic light-emitting element 31 using separate substrates. The integrated circuit 5 included in the organic EL display device 1 is electrically connected with both the touch electrodes 11 to 18 and the organic light-emitting elements 31. Accordingly, it is possible to use the integrated circuit 5 common to both the touch sensor 3 and the organic light-emitting elements 31. Thus, the organic EL display device 1 can achieve a reduced number of components.

According to the present embodiment, the touch sensor 3 and the organic light-emitting elements 31 are formed on the first substrate 2. Thus, for example, a process of attaching a substrate on which a touch sensor is provided to a substrate on which an organic light-emitting element is provided can be omitted. Accordingly, in the present embodiment, it is possible to avoid error in a bonding position, an insufficient bonding intensity, and generation of a defective product due to, for example, incorporation of an air bubble or a foreign object, which can be caused by a process of attaching substrates to each other. In addition, in the present embodiment, the integrated circuit 5 is electrically connected with both the touch sensor 3 and the organic light-emitting elements 31. This facilitates synchronous control of the touch sensor 3 and the organic light-emitting elements 31 by the integrated circuit 5.

The organic EL display device 1 includes the terminal part 41a electrically connected with the integrated circuit 5 and provided overlapping with the connection region 11b of the touch electrode 11 with the insulating film 21 interposed therebetween. The touch electrode 11 and the integrated circuit 5 are electrically connected with each other through the capacitor 61 including the connection region 11b of the touch electrode 11, the insulating film 21, and the terminal part 41a. Accordingly, for example, even when the insulating film 21 is not provided with an opening so as not to bring the terminal part 41a and the connection region 11b into contact with each other through the opening, the touch electrode 11 and the integrated circuit 5 can be electrically connected with each other. In this case, a process of forming the opening in the insulating film 21 can be omitted, and thus a cost of manufacturing the organic EL display device 1 can be reduced.

Figure 3:
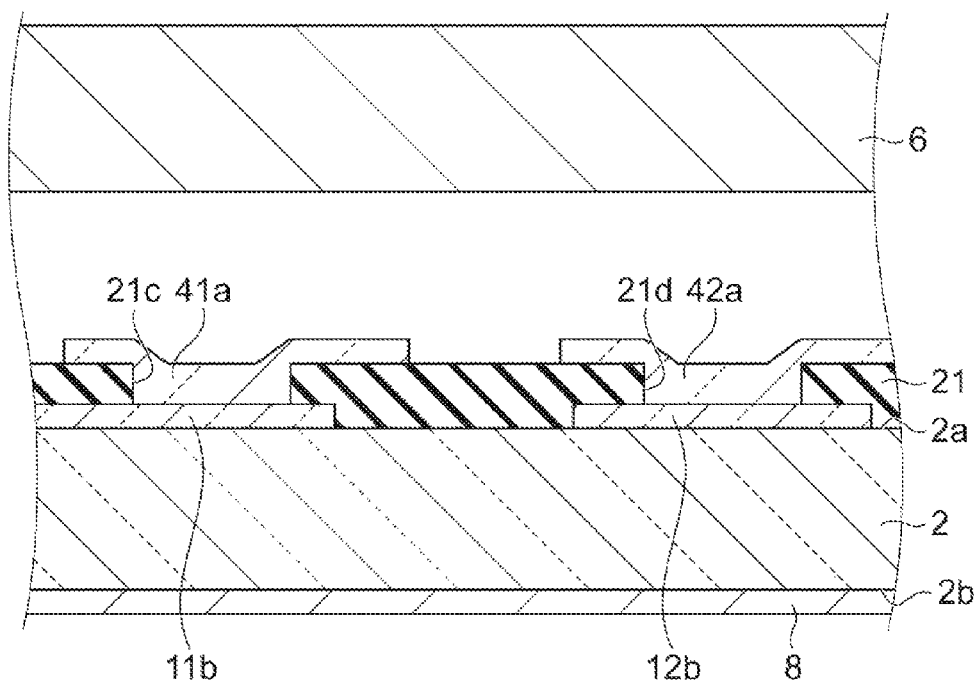
FIG. 3 is a schematic cross-sectional view for description of a connection between touch electrodes and an integrated circuit of a touch sensor in an organic EL display device according to a first modification.

The following describes a first modification of the present embodiment with reference to FIG. 3. As illustrated in FIG. 3, an opening 21c through which the connection region 11b is exposed, and an opening 21d through which the connection region 12b is exposed are formed in the insulating film 21. With this configuration, the terminal part 41a is connected with the connection region 11b through the opening 21c, and the terminal part 42a is connected with the connection region 12b through the opening 21d. In the first modification, openings are formed at part of the insulating film 21, the part overlapping with end parts of the connection regions 13b to 18b. Thus, the connection regions 13b to 18b are connected with the terminal parts 43a to 48a, respectively, through the corresponding openings. In this case, the integrated circuit 5 and the touch sensor 3 can be electrically connected through the terminal parts 41a to 48a in a reliable manner.

Figure 4:
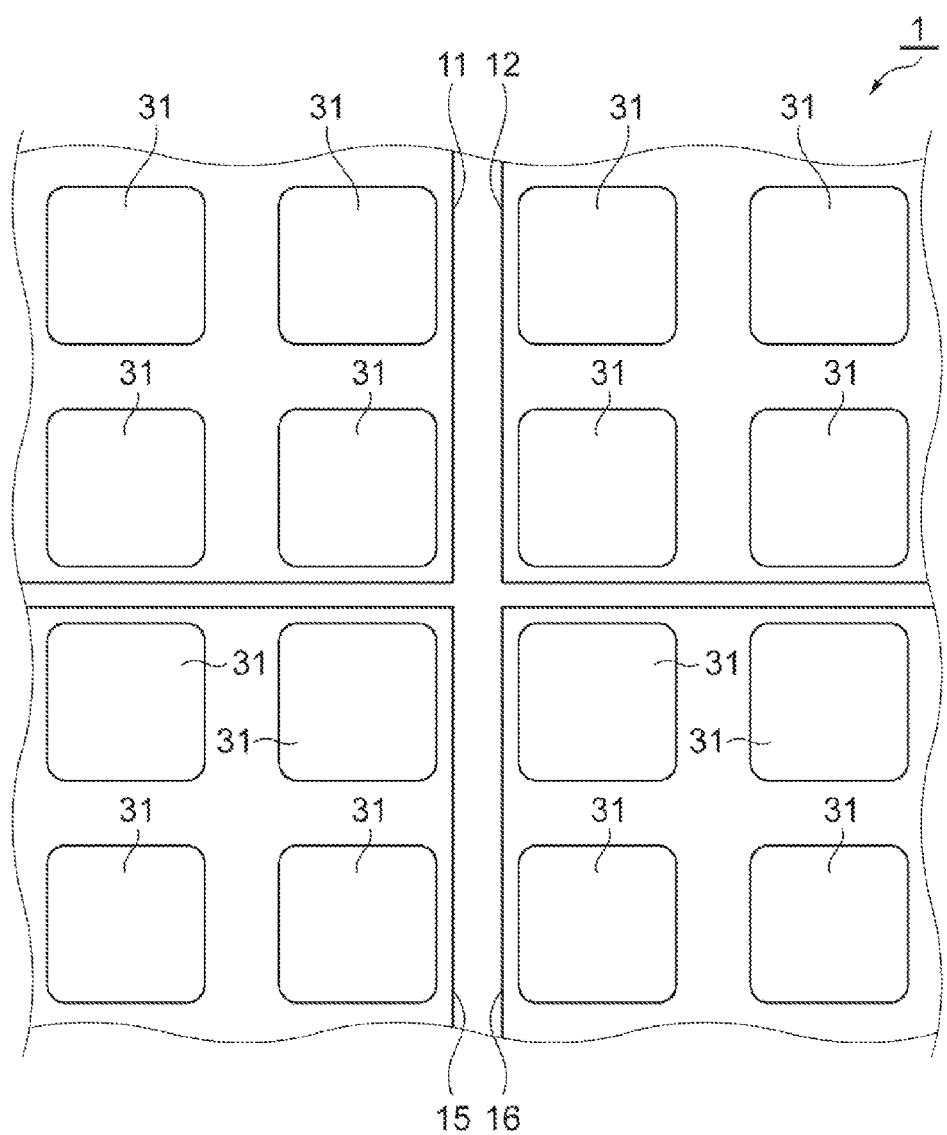
FIG. 4 is a schematic plan view illustrating a relation between the touch electrodes and organic light-emitting elements of the touch sensor in the organic EL display device according to a second modification.

The following describes a second modification of the present embodiment with reference to FIG. 4. As illustrated in FIG. 4, each of the organic light-emitting elements 31 disposed in matrix overlaps with any one of the touch electrodes 11, 12, 15, and 16 but with none of edges of the touch electrodes 11, 12, 15, and 16 in plan view. In other words, each of the organic light-emitting elements 31 completely overlaps with any one of the touch electrodes 11, 12, 15, and 16 in plan view. In the second modification, any organic light-emitting element 31 overlapping with any one of the touch electrodes 13, 14, 17, and 18 overlaps with none of edges of the touch electrodes 11 to 18.

In this case, in plan view, coexistence of a region in which the organic light-emitting elements 31 overlap with any one of the touch electrodes 11 to 18 and a region in which the organic light-emitting elements 31 overlap with none of the touch electrodes 11 to 18 can be prevented. Accordingly, in the second modification, light emitted by the organic light-emitting elements 31 toward the first substrate 2 passes through any one of the touch electrodes 11 to 18, and thus unevenness of the light emitted by the organic light-emitting elements 31 due to the touch electrodes 11 to 18 can be reduced.

Figure 5:
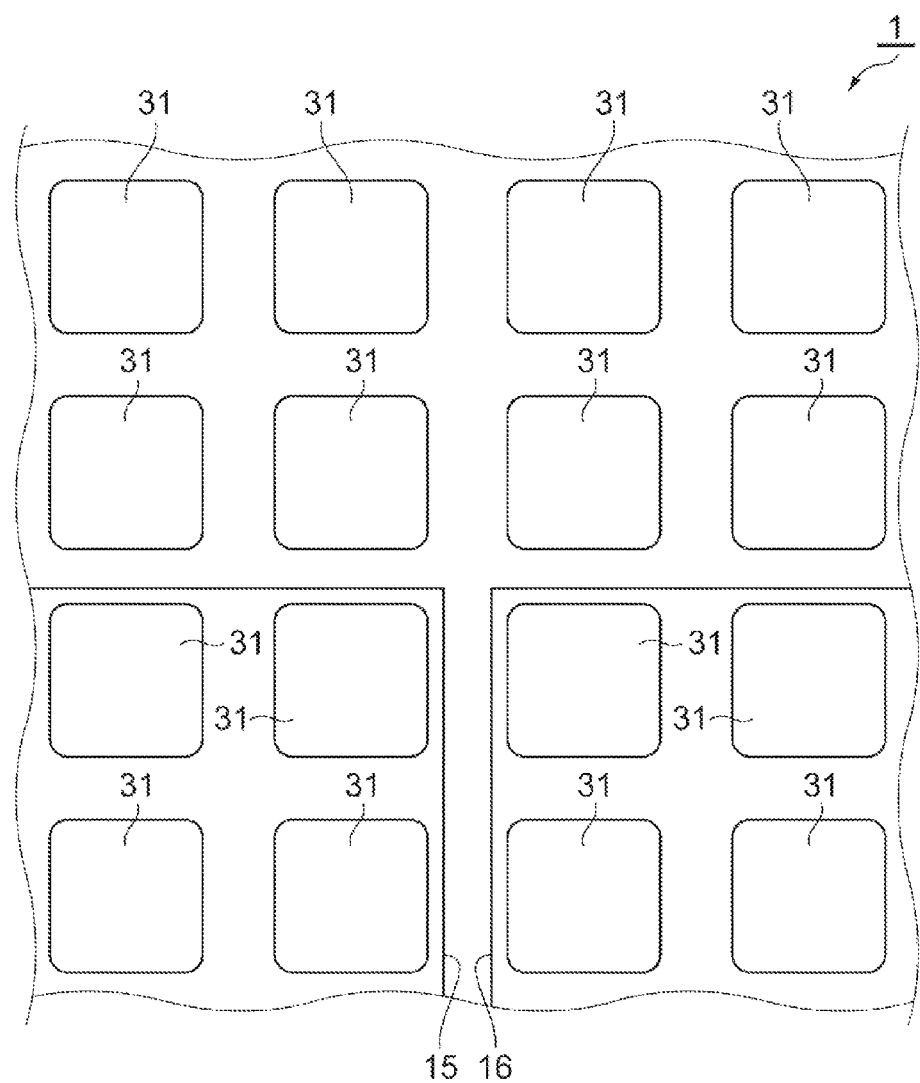
FIG. 5 is a schematic plan view illustrating a relation between the touch electrodes and the organic light-emitting elements of the touch sensor in the organic EL display device according to a third modification.

The following describes a third modification of the present embodiment with reference to FIG. 5. As illustrated in FIG. 5, part of the organic light-emitting elements 31 disposed in matrix overlaps with any one of the touch electrodes 15 and 16 in plan view but with none of the edges of the touch electrodes 15 and 16. The rest of the organic light-emitting elements 31 overlaps with none of the touch electrodes 15 and 16 in plan view. In other words, the rest of the organic light-emitting elements 31 completely overlaps with none of the touch electrodes in plan view.

In the third modification, similarly to the second modification, each of the organic light-emitting elements 31 overlaps with none of the edges of the touch electrodes 11 to 18. In other words, none of the organic light-emitting elements 31 partially overlap with the touch electrodes 11 to 18 in plan view. Thus, the light emission unevenness due to the touch electrodes is reduced in both of the part of the organic light-emitting elements 31 overlapping with any one of the touch electrodes 11 to 18, and the rest of the organic light-emitting elements 31 overlapping with none of the touch electrodes 11 to 18. In addition, both of a region in which the touch sensor 3 functions and a region in which the touch sensor 3 does not function can be provided in the light-emitting region 4 of the organic EL display device 1.

In the second modification and the third modification described above, the integrated circuit 5 does not necessarily need to be electrically connected with both the touch sensor 3 and the light-emitting region 4. In this case, a substrate on which the touch sensor 3 and the integrated circuit are provided and a substrate on which the organic light-emitting elements 31 and any other integrated circuit are provided may be different substrates. In such a case, advantages of the second modification and the third modification can also be sufficiently obtained.

An organic EL display device according to the present invention is not limited to the above-described embodiment and modifications, but any other various modifications are possible. For example, in the above-described embodiment and modifications, the integrated circuit 5 is provided between the first substrate 2 and the second substrate 6, but the present invention is not limited thereto. For example, the integrated circuit 5 may be integrated with the flexible printed circuit 7 and does not need to be provided between the first substrate 2 and the second substrate 6.

In the above-described embodiment and modifications, the organic EL display device 1 is not limited to a passive matrix display device. For example, the organic EL display device 1 may be an active matrix display device. In this case, for example, a transistor corresponding to each organic light-emitting element 31 is provided to the light-emitting region 4.

In the above-described embodiment and modifications, both of the electrode 34 and the second substrate 6 may be transmissive. In this case, the organic EL display device 1 can be a see-through display device.

In the above-described embodiment and modifications, both of the first substrate 2 and the second substrate 6 may be flexible. In this case, the organic EL display device 1 can be a flexible display device. In addition, the first substrate 2 and the second substrate 6 are each not limited to a substantially rectangular shape in plan view. For example, the first substrate 2 and the second substrate 6 may each have a polygonal shape or a substantially circular shape in plan view.

In the above-described embodiment and modifications, a touch sensor of another scheme may be used as the touch sensor 3. For example, a projected capacitive touch sensor may be used. In this case, each touch electrode may have a laminated structure.

This application is based on Japanese Patent Application serial no. 2016-023841 filed with Japan Patent Office on Feb. 10, 2016, the entire contents of which are hereby incorporated by reference.

What is claimed is:

1. An organic electro-luminescence display device comprising:
   a first substrate having transmissive properties;
   a touch electrode for a touch sensor, the touch electrode being provided on a main surface of the first substrate;
   an insulating film provided on the main surface and covering the touch electrode, wherein the insulating film includes a first surface at the touch electrode-side and a second surface opposite to the first surface;
   an organic light-emitting element provided on the second surface of the insulating film;
   a second substrate provided facing the main surface of the first substrate; and
   an integrated circuit electrically connected with both the touch electrode and the organic light-emitting element,
   wherein the touch electrode, the insulating film, and the organic light-emitting element are interposed between the first substrate and the second substrate.

2. The organic electro-luminescence display device according to claim 1, further comprising a wiring terminal electrically connected with the integrated circuit,
   wherein the wiring terminal is provided overlapping with part of the touch electrode with the insulating film interposed between the touch electrode and the wiring terminal, and
   wherein the touch electrode and the integrated circuit are electrically connected with each other through a capacitor constituted by the touch electrode, the insulating film, and the wiring terminal.

3. The organic electro-luminescence display device according to claim 1, further comprising a wiring terminal electrically connected with the integrated circuit,
   wherein the wiring terminal is provided in touch with the touch electrode, and
   wherein the wiring terminal is connected with the touch electrode through an opening provided in the insulating film.

4. The organic electro-luminescence display device according to claim 1, wherein the organic light-emitting element does not overlap with an edge of the touch electrode in plan view.

5. The organic electro-luminescence display device according to claim 4,
   wherein a plurality of the touch electrodes are provided on the main surface of the first substrate,
   wherein a plurality of the organic light-emitting elements are provided on the insulating film, and
   wherein each of the organic light-emitting elements overlaps with any one of the touch electrodes but with none of edges of the touch electrodes in plan view.

6. The organic electro-luminescence display device according to claim 4,
   wherein a plurality of the touch electrodes are provided on the main surface of the first substrate,
   wherein a plurality of the organic light-emitting elements are provided on the insulating film,
   wherein part of the organic light-emitting elements overlaps with any one of the touch electrodes but with none of edges of the touch electrodes in plan view, and
   wherein rest of the organic light-emitting elements overlaps with none of the touch electrodes in plan view.

7. The organic electro-luminescence display device according to claim 1,
   wherein the integrated circuit is provided between the first substrate and the second substrate.

* * * * *